US011197394B2

(12) United States Patent
Campbell et al.

(10) Patent No.: US 11,197,394 B2
(45) Date of Patent: Dec. 7, 2021

(54) PROTECTIVE LOUVER ASSEMBLY FOR AIR-MOVING ASSEMBLY

(71) Applicant: INTERNATIONAL BUSINESS MACHINES CORPORATION, Armonk, NY (US)

(72) Inventors: Levi A. Campbell, Poughkeepsie, NY (US); Christopher R. Ciraulo, Wappingers Falls, NY (US); Milnes P. David, Poughkeepsie, NY (US); Dustin W. Demetriou, New York, NY (US); Robert K. Mullady, Highland, NY (US); Roger R. Schmidt, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 310 days.

(21) Appl. No.: 15/820,571

(22) Filed: Nov. 22, 2017

(65) Prior Publication Data

US 2018/0098463 A1 Apr. 5, 2018

Related U.S. Application Data

(63) Continuation of application No. 14/499,402, filed on Sep. 29, 2014, now Pat. No. 9,861,010.

(51) Int. Cl.
*H05K 7/20* (2006.01)

(52) U.S. Cl.
CPC ..... *H05K 7/20727* (2013.01); *H05K 7/20172* (2013.01); *H05K 7/20181* (2013.01)

(58) Field of Classification Search
CPC ................................. H05K 7/20181
See application file for complete search history.

(56) References Cited

U.S. PATENT DOCUMENTS 2,849,806 A 9/1958 Grahek
5,562,410 A 10/1996 Sach et al.
(Continued)

FOREIGN PATENT DOCUMENTS

CN 2907195 Y 5/2007
CN 203098342 U 7/2013
(Continued)

OTHER PUBLICATIONS

Campbell et al., "List of IBM Patents or Patent Applications Treated as Related", U.S. Appl. No. 15/820,571, filed Nov. 22, 2017, dated Dec. 21, 2017 (2 pages).
(Continued)

*Primary Examiner* — Steven B McAllister
*Assistant Examiner* — Elizabeth M. May
(74) *Attorney, Agent, or Firm* — Tihon Poltavets, Esq.; Kevin P. Radigan, Esq.; Heslin Rothenberg Farley & Mesiti P.C.

(57) ABSTRACT

Apparatuses and methods are provided for blocking removal of an air-moving assembly from a housing when in operational state. The apparatus includes a protective louver assembly having a louver(s) and an interlock element(s). The louver(s) is disposed at an air inlet or an air outlet of the air-moving assembly, and pivots between an operational and a quiesced orientation, dependent on presence or absence, respectively, of airflow through the air-moving assembly. The interlock element(s) is associated with the louver(s) to pivot with the louver(s) between the operational orientation and the quiesced orientation. In the operational orientation, the interlock element(s) blocks, at least in part, access to at least one fastener securing the air-moving assembly within the housing, and thereby prevents removal of the air-moving assembly from the chassis when in the operational state.

20 Claims, 12 Drawing Sheets

(56) References Cited

U.S. PATENT DOCUMENTS

| | | |
|---|---|---|
| 6,005,770 A | 12/1999 | Schmitt |
| 6,075,698 A | 6/2000 | Hogan et al. |
| 6,115,250 A | 9/2000 | Schmitt |
| 6,663,461 B2 | 12/2003 | Fong |
| 6,710,240 B1 | 3/2004 | Chen et al. |
| 6,711,013 B2 | 3/2004 | Wobig et al. |
| 6,714,411 B2 | 3/2004 | Thompson et al. |
| 6,817,889 B2 | 11/2004 | Chang et al. |
| 6,947,281 B2 | 9/2005 | Wycraft et al. |
| 7,033,206 B2 | 4/2006 | Chang et al. |
| 7,357,708 B2 | 4/2008 | Lee |
| 7,800,902 B2 | 9/2010 | Della Fiora et al. |
| 8,056,990 B2 | 11/2011 | Ye |
| 8,320,121 B2 | 11/2012 | Bisson et al. |
| 8,425,286 B2 | 4/2013 | Coster et al. |
| 8,899,066 B2 | 12/2014 | Mahajan |
| 9,247,673 B2 | 1/2016 | Kelaher et al. |
| 9,568,011 B2 | 2/2017 | David et al. |
| 9,629,284 B2 | 4/2017 | Campbell et al. |
| 9,648,786 B2 | 5/2017 | Campbell et al. |
| 2002/0141879 A1 | 10/2002 | Casey et al. |
| 2005/0113015 A1 | 5/2005 | Crippen et al. |
| 2006/0087814 A1* | 4/2006 | Brandon ............ H05K 7/20563 361/694 |
| 2008/0123280 A1 | 5/2008 | Chen et al. |
| 2008/0280552 A1 | 11/2008 | Baker et al. |
| 2012/0138262 A1 | 6/2012 | Zhang et al. |
| 2012/0275917 A1* | 11/2012 | Liu ...................... F04D 29/601 415/213.1 |
| 2013/0130611 A1 | 5/2013 | Dinicolas |
| 2013/0160984 A1 | 6/2013 | Cash et al. |
| 2013/0323044 A1 | 12/2013 | Sun |
| 2014/0209695 A1 | 7/2014 | Frank |
| 2014/0211419 A1* | 7/2014 | Liao ................... H05K 7/20181 361/695 |
| 2015/0252813 A1* | 9/2015 | Shih ...................... F04D 19/002 415/146 |
| 2016/0081220 A1 | 3/2016 | Chia et al. |
| 2016/0095257 A1 | 3/2016 | Campbell et al. |
| 2016/0095258 A1 | 3/2016 | Campbell et al. |
| 2016/0095259 A1 | 3/2016 | Campbell et al. |
| 2016/0095260 A1 | 3/2016 | Campbell et al. |

FOREIGN PATENT DOCUMENTS

| | | |
|---|---|---|
| GB | 1 377 387 | 12/1974 |
| JP | 10126079 A | 5/1998 |
| JP | 2002-164681 A | 6/2002 |
| JP | 2006-344661 A | 12/2006 |
| JP | 2008-17099 A | 7/2008 |

OTHER PUBLICATIONS

Campbell et al., "Replacement List of IBM Patents or Patent Applications Treated as Related", U.S. Appl. No. 15/820,571, filed Nov. 22, 2017 (U.S. Patent Publication No. 2018/0098463 A1), dated May 9, 2018 (2 pages).

* cited by examiner

PROTECTIVE LOUVER ASSEMBLY FOR AIR-MOVING ASSEMBLY

BACKGROUND

In many server applications, processors along with their associated electronics (e.g., memory, disk drives, power supplies, etc.) are packaged in removable drawer or subsystem configurations stacked within an electronics rack or frame comprising information technology (IT) equipment. In other cases, the electronics may be in fixed locations within the rack or frame. As circuit densities continue to increase at all levels of packaging, there is an ever-growing need for providing continuous cooling to the electronics rack, including the electronic subsystems thereof. As one solution, a cooling apparatus may be provided which includes one or more air-moving assemblies (e.g., axial fans or centrifugal fans) which facilitate moving an airflow through the electronics rack, usually front-to-back.

In certain implementations, multiple air-moving assemblies may be provided in association with a drawer or electronics subsystem in order that the assemblies may be concurrently maintainable, such that if one fails, the failure does not stop airflow through the electronics subsystem, and thus negatively affect operational availability of computing resources to the customer. In the event that an operating air-moving assembly is mistakenly removed, the fan or impeller wheel may be spinning at a high speed, for instance, at 4000 RPMs or above, and have significant momentum, due to the mass of the fan or impeller. This action could potentially result in injury to the operator removing the air-moving assembly.

SUMMARY

The shortcomings of the prior art are overcome and additional advantages are provided through the provision, in one aspect, of an apparatus which includes a protective louver assembly. The protective louver assembly includes at least one louver, and at least one interlock element. The at least one louver is disposed at one of an air inlet or an air outlet of an air-moving assembly. The air-moving assembly is removable when in a non-operational state from a housing within which the air-moving assembly resides when in an operational state, and the louver(s) pivots between an operational orientation and a quiesced orientation, dependent on presence or absence, respectively, of airflow through the air-moving assembly. The at least one interlock element is associated with the at least one louver to pivot with the at least one louver between the operational orientation and the quiesced orientation. The at least one interlock element blocks, at least in part, access in the operational orientation to at least one fastener securing the air-moving assembly within the housing.

In another aspect, an apparatus is provided which includes an air-moving assembly and a protective louver assembly. The air-moving assembly is removable from a housing within which the air-moving assembly resides when in an operational state, and the protective louver assembly includes at least one louver, and at least one interlock element. The at least one louver is disposed at one of an air inlet or an air outlet of the air-moving assembly, and the louver(s) pivots between an operational orientation and a quiesced orientation, dependent on presence or absence, respectively, of airflow through the air-moving assembly. The at least one interlock element is associated with the at least one louver to pivot with the at least one louver between the operational orientation and the quiesced orientation. The at least one interlock element blocks, at least in part, access in the operational orientation to the at least one fastener securing the air-moving assembly within the housing.

In a further aspect, a method is provided, which includes: associating a protective louver assembly with an air-moving assembly, the air-moving assembly residing within a housing when in operational state and being removable from the housing when in a non-operational state. The protective louver assembly includes: at least one louver disposed at one of an air inlet or an air outlet of the air-moving assembly, the at least one louver pivoting between an operational orientation and a quiesced orientation, dependent on presence or absence, respectively, of airflow through the air-moving assembly; and at least one interlock element associated with the at least one louver to pivot with the at least one louver between the operational orientation and the quiesced orientation, the at least one interlock element blocking, at least in part, access in the operational orientation to at least one fastener securing the air-moving assembly within the housing.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

As used herein, the term "electronics rack" refers to any housing, frame, rack, compartment, blade server system, etc., having one or more heat-generating components of a computer system, electronic system, or information technology (IT) equipment, and may include, for example, a standalone computer processing system having high, mid, or low-end processing capability. In one embodiment, an electronics rack may include one or more electronic subsystems, for example, in one or more servers, sub-housings, blades, drawers, nodes, compartments, boards, etc., having one or more heat-generating electronic components disposed therein or thereon. An electronic system or subsystem may be removable or fixed, for example, relative to an electronics rack, with rack-mounted electronic drawers of an electronics rack and blades of a blade-center system being two examples of electronic systems or subsystems of an electronics rack to be cooled. As noted, in one embodiment, an electronic system/subsystem may include, or be, a server unit. Further, as used herein, the term "chassis" or "electronics chassis" refers to any housing, container, frame, rack, compartment, etc., and may be, in one embodiment, an electronics rack, or an electronic subsystem chassis which resides within the electronics rack.

Reference is made below to the drawings, where the same reference numbers used throughout different figures designate the same or similar components.

Figure 1:
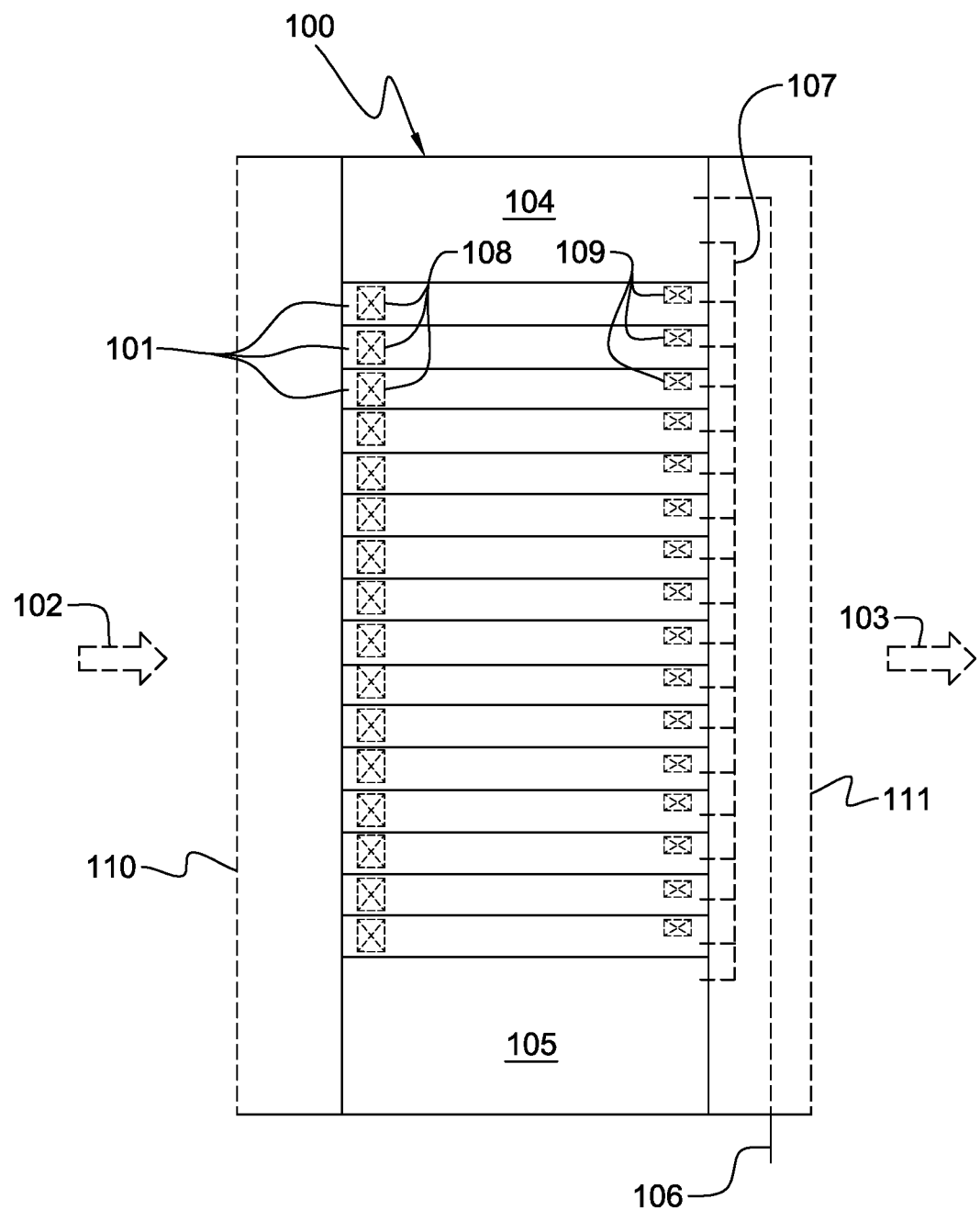
FIG. 1 is an elevational depiction of one embodiment of an electronics rack to incorporate therein one or more apparatuses, in accordance with one or more aspects of the present invention.

FIG. 1 depicts (by way of example) one embodiment of an electronics rack 100 with a plurality of electronic subsystems 101 to be cooled. In the embodiment illustrated, electronic subsystems 101 are air-cooled by cool airflow 102 ingressing via an air inlet 110, and exhausting out an air outlet 111 as hot airflow 103. One or more air-moving assemblies 108 are provided at the air inlet sides of electronic subsystems 101 and/or one or more air-moving assemblies 109 are provided at the air outlet sides of electronic subsystems 101 to facilitate airflow through the individual subsystems 101 as part of the cooling apparatus of electronics rack 100. By way of example, air-moving assemblies 108 at the air inlets to electronic subsystems 101 may be or include axial fan assemblies, and air-moving assemblies 109 disposed at the air outlets of electronic subsystems 101 may be or include centrifugal fan assemblies. One or more of electronic subsystems 101 may include heat-generating components to be cooled of a computer system, electronics system, or information technology (IT) equipment. For instance, one or more of the electronic subsystems 101 may include one or more processors and associated memory.

Electronics rack 100 may also include, by way of example only, one or more bulk power assemblies 104 of an AC to DC power supply assembly. AC to DC power supply assembly further includes, in one embodiment, a frame controller, which may be resident in the bulk power assembly 104 and/or in one or more electronic subsystems 101. Also illustrated in FIG. 1 is one or more input/output (I/O) drawer(s) 105, which may also include a switch network. I/O drawer(s) 105 may include, as one example, PCI slots and disk drivers for the electronics rack.

In implementation, a three-phase AC source feeds power via an AC power supply line cord 106 to bulk power assembly 104, which transforms the supplied AC power to an appropriate DC power level for output via distribution cable 107 to the plurality of electronic subsystems 101 and I/O drawer(s) 105. The number of electronic subsystems installed in the electronics rack is variable, and depends on customer requirements for a particular system. Further, although described with reference to multiple electronic subsystems 101, the air-moving assemblies discussed herein could reside within, for instance, bulk power assembly 104, or I/O drawer(s) 105. Again, the particular electronics rack configuration of FIG. 1 is presented by way of example only, and not by way of limitation.

Figure 2:
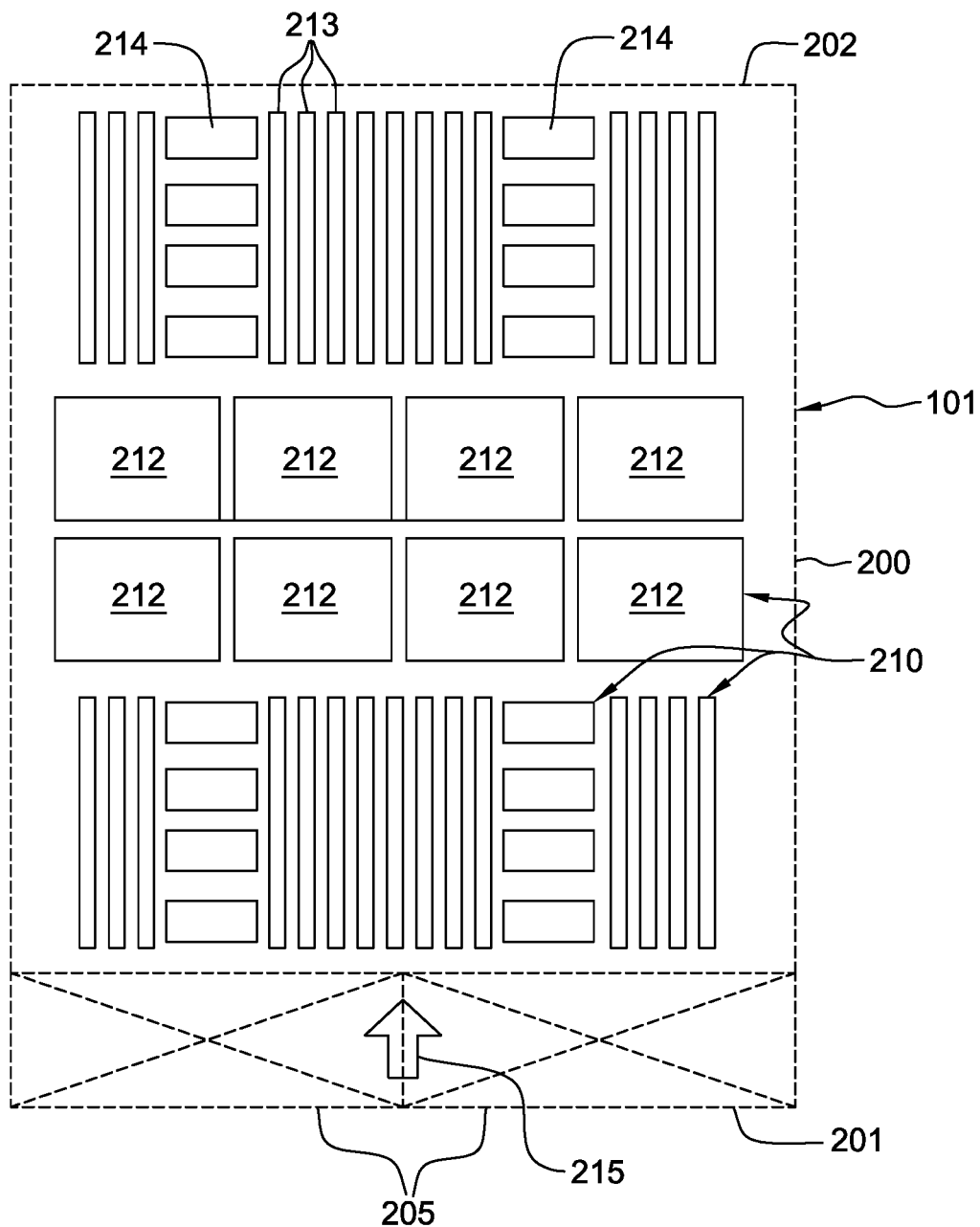
FIG. 2 is a plan view of one embodiment of an electronic subsystem layout illustrating multiple air-moving assemblies at an air inlet side of the electronic subsystem, which may incorporate one or more apparatuses, in accordance with one or more aspects of the present invention.

FIG. 2 depicts one embodiment of an electronic subsystem 101 layout being air-cooled utilizing one air-cooling approach, where one or more air-moving assemblies 205 provide forced airflow 215 in operational state to cool multiple electronic components 210 within electronic subsystem 101. Cool air is taken in through an air inlet 201 and heated air is exhausted out an air outlet 202 of the electronic subsystem. The multiple components 210 to be cooled may include, by way of example, multiple processor modules 212, as well as multiple arrays of memory modules 213 (e.g., dual-in-line memory modules (DIMMs)) and multiple rows of memory support modules 214 (e.g., DIMM control modules). In one implementation, air-cooled heat sinks (not shown) may be coupled to one or more of processor modules 212, memory modules 213, and/or memory support modules 214 to facilitate dissipation of heat therefrom.

In the depicted example of FIG. 2, the air-moving assemblies 205, as well as the electronic components, reside within a chassis 200 containing or supporting the electronic subsystem. Also, as depicted, the air-moving assemblies 205 disposed at the air inlet side 201 of the electronic subsystem may be redundant fan assemblies, which concurrently provide the cooling airflow 215 across or through the electronic components of the electronic subsystem.

Figure 3A:
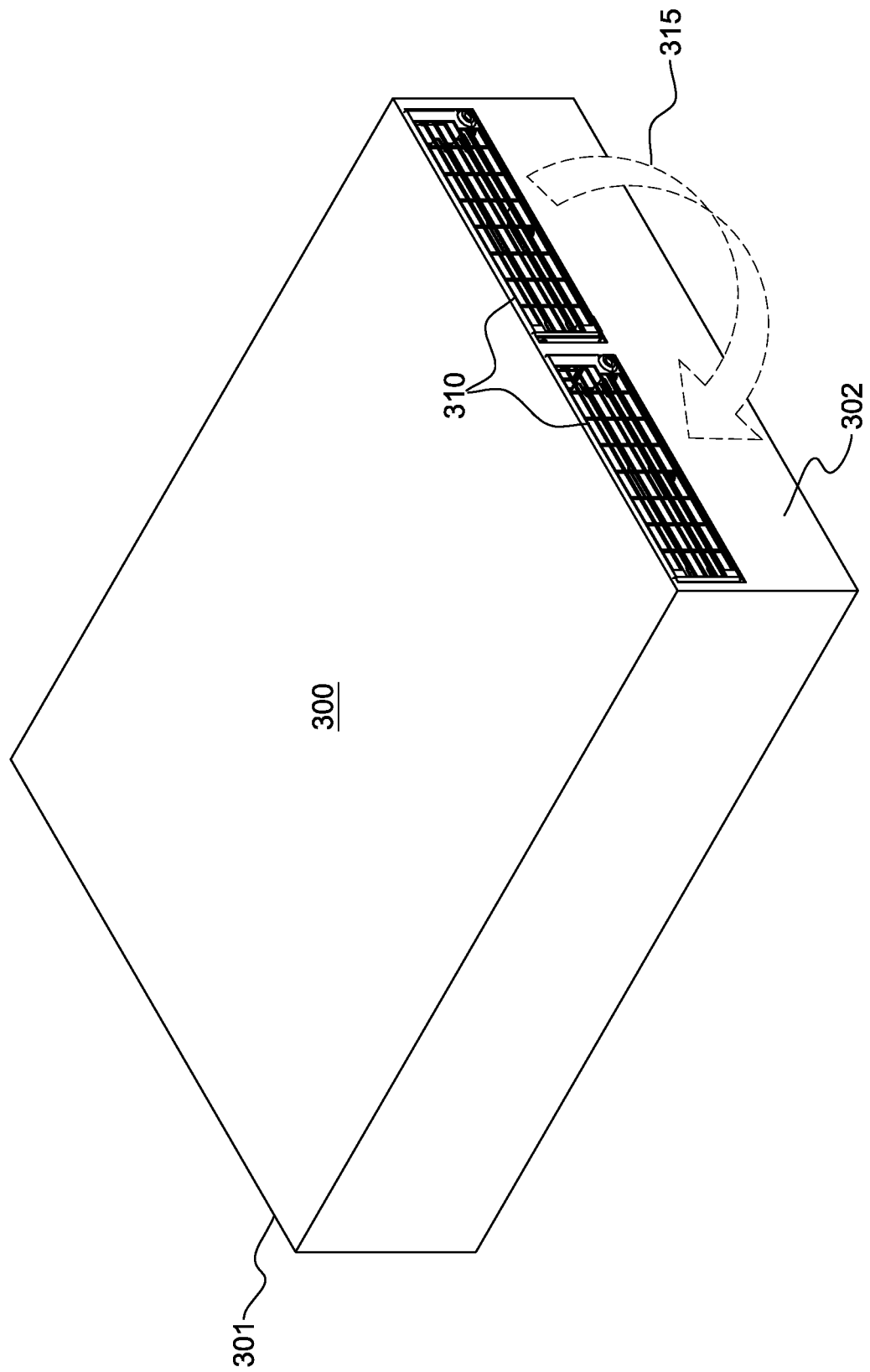
FIG. 3A depicts one embodiment of a chassis with multiple air-moving assemblies disposed at an air outlet side thereof, which may incorporate one or more apparatuses, in accordance with one or more aspects of the present invention.

FIG. 3A partially depicts an alternate embodiment of an electronic subsystem layout which includes a chassis 300, and redundant air-moving assemblies 310 disposed at an air outlet side 302 of the electronic subsystem, with the air inlet side 301 being, by way of example, at an opposite side of chassis 300. As illustrated in FIG. 3A, assuming that the left air-moving assembly 310 is in a quiesced state, for instance, has been turned off or has failed, then a portion of air egressing from the operating, right air-moving assembly 310 can re-circulate 315 through the left air-moving assembly 310, and be drawn back into the right air-moving assembly 310, potentially significantly reducing the amount of airflow through chassis 300, and thus potentially the cooling of the electronic components of the electronic subsystem.

Figure 3B:
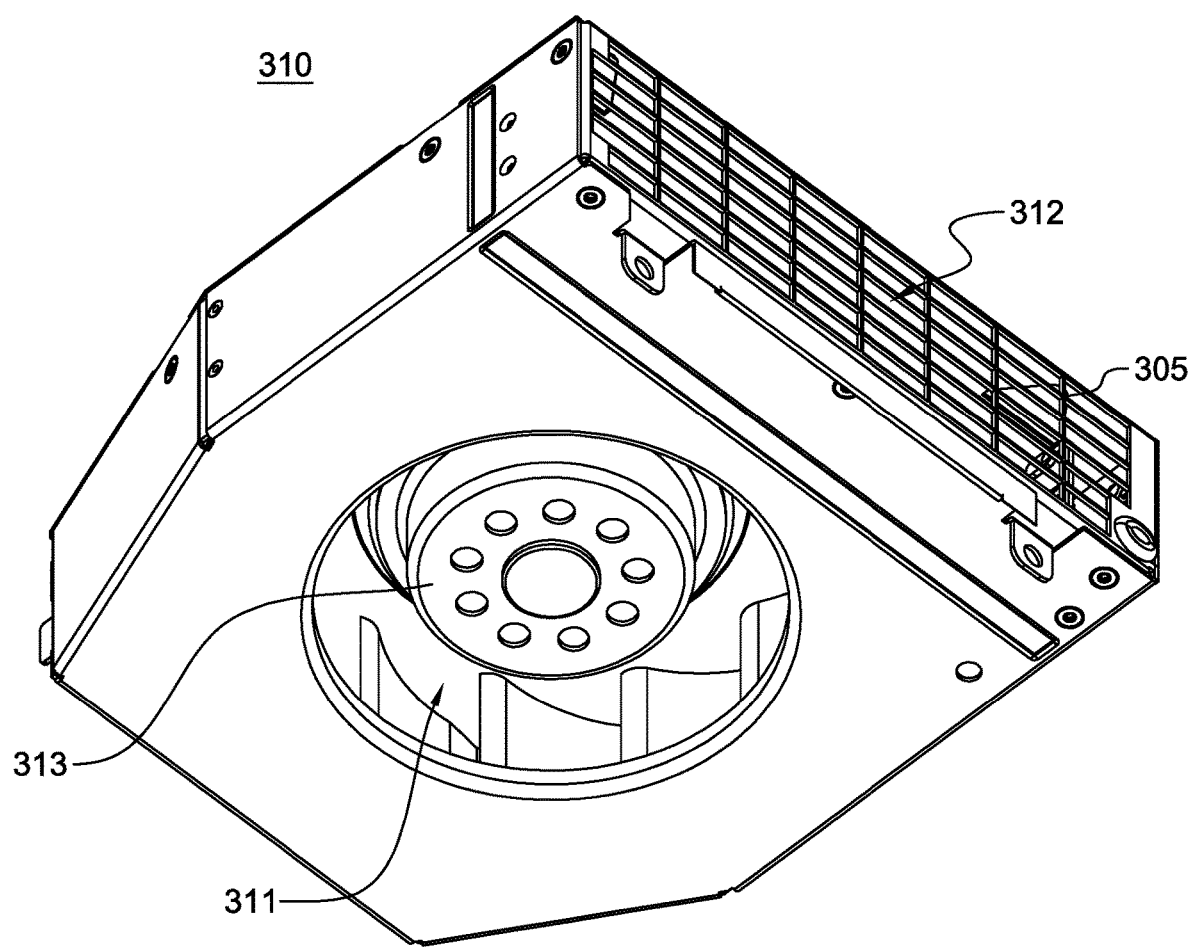
FIG. 3B depicts one embodiment of an air-moving assembly of FIG. 3A, shown removed from the chassis.

FIG. 3B depicts one embodiment of air-moving assembly 310 of FIG. 3A. In this embodiment, air-moving assembly 310 is depicted as a centrifugal fan assembly with a relatively large air inlet opening 311 in a lower surface thereof, exposing the centrifugal blower 313, and an air outlet 312, which may have a grating 305 as a safety feature. As noted above, in many systems today, air-moving assemblies may be designed to be concurrently maintainable, so that one assembly entering into a quiesced state does not significantly impact system cooling, and thus operational availability of computing resources to a customer. In the event that an operating air-moving assembly 310 is mistakenly removed, the fan or impeller wheel may be spinning at a high speed, and has significant momentum due to its mass. This mistake could result in injury to the operator removing the assembly, particularly in a centrifugal fan design such as illustrated in FIG. 3B, where there is a relatively large air inlet 311 within the assembly.

One possible solution to the issue is to provide a grill with openings smaller than an operator's fingers at the air assembly's inlet. However, this could significantly impede airflow through the assembly. An alternate approach is to disallow redundancy for concurrent replaceability, which is undesirable, since a customer could experience a computing outage due to a single air-moving assembly transitioning to quiesced state, for instance, due to a failure.

As a solution, disclosed herein are apparatuses and methods which address the above-noted drawbacks to existing concurrently-maintainable, air-moving assemblies. The apparatuses may include, for instance, a protective louver assembly. The protective louver assembly includes at least one louver, and at least one interlock element, such as an interlock tab. The at least one louver is disposed at one of an air inlet or an air outlet of an air-moving assembly, where the air-moving assembly is removable from a chassis within which the air-moving assembly resides when in an operational state. The louver(s) pivots between an operational orientation and a quiesced orientation, dependent on presence or absence, respectively, of airflow through the air-moving assembly. The at least one interlock element is associated with the at least one louver to pivot with the at least one louver between the operational orientation and the quiesced orientation. The at least one interlock element blocks, at least in part, access in the operational orientation to at least one fastener securing the air-moving assembly within the chassis.

In certain implementations, one interlock element of the at least one interlock element is attached to and projects at an angle from the one louver of the at least one louver to block, at least in part, access to the at least one fastener in the operational orientation of the one louver. For instance, the one interlock element of the at least one interlock element may extend substantially 90° from the one louver. In such an implementation, the one louver may be substantially horizontal when in the operational orientation, and the one interlock element may project therefrom substantially vertically.

In one implementation, a protective shroud at least partially encloses the at least one fastener. The protective shroud includes at least one access opening allowing access to the enclosed fastener(s), and the interlock element(s) extends in the operational orientation into an at least partially enclosed region defined by the protective shroud. The at least one interlock element blocks access to the at least one fastener through the at least one access opening within the shroud in the operational orientation of the at least one louver. By way of example, the one louver is substantially horizontal in the operational orientation, and the one interlock element projects upwards therefrom in a substantially vertical direction in the operational orientation of the one louver. The vertically projecting at least one interlock element extends, in one embodiment, between the at least one access opening of the protective shroud and the at least one fastener.

In certain implementations, the protective louver assembly comprises multiple louvers disposed at one of the air inlet or air outlet of the air-moving assembly, wherein the multiple louvers include the at least one louver. Each louver of the multiple louvers may pivot or hinge between the operational orientation and the quiesced orientation, dependent on presence or absence, respectively, of airflow through the air-moving assembly. In one implementation, one louver of the multiple louvers is sized smaller than another louver of the multiple louvers, with the one louver including one interlock element of the at least one interlock element. For instance, the one louver may be sized smaller than another louver to remain in the operational orientation longer than the another louver during a transition of the multiple louvers from the operational orientation to the quiesced orientation due to a decreasing airflow through the air-moving assembly. In one example, the one louver may be half the size, or less, of the another louver of the multiple louvers.

The at least one louver and at least one interlock element of the protective louver assembly may be disposed at either the air inlet or the air outlet of the air-moving assembly, for instance, dependent on the type of air-moving assembly, that is, whether the assembly includes an axial fan or a centrifugal fan configuration. In one embodiment, the air-moving assembly is a centrifugal fan, and the protective louver assembly is disposed at the air outlet of the air-moving assembly.

Advantageously, the louvers of the protective louver assembly operate as anti-recirculation louvers when the air-moving assembly is in quiesced orientation. Further, the interlock element(s) of the protective louver assembly prevent or inhibit removal of the air-moving assembly from the chassis while there is still sufficient airflow through the air-moving assembly to prevent the respective louver(s) from obtaining the quiesced orientation. This advantageously prevents removal of the air-moving assembly from the chassis until the rotor of the assembly is below a safe operational speed.

The interlock element(s) (e.g., tabs) associated with the one or more louvers of the protective louver assembly may extend from the louver assembly in any desired location in order to project therefrom in the operational orientation into a region adjacent to the air-moving assembly which will block or inhibit access to the one or more fasteners securing the air-moving assembly in the chassis. In certain embodiments, a protective shroud is provided enclosing the one or more fasteners and limiting access to the fasteners, except through one or more access openings in the shroud. In this configuration, the interlock element(s) may extend at least partially into an at least partially enclosed region defined by the shroud and block an operator's access to the fastener(s) through the access opening(s). Further, depending on the implementation, one or more louvers of the multiple louvers may be sized smaller than one or more other louvers of the multiple louvers, with the interlock element(s) projecting from one or more of the smaller louvers. By sizing certain louvers smaller than others, the smaller louvers will remain open longer during transition of the multiple louvers from an operational orientation to a quiesced orientation due to a decreasing airflow through the air-moving assembly. This ensures that the interlock element(s) continues to block access to the fastener(s) until the airflow through the air-moving assembly is decreased to a safe level.

In one implementation, an upper louver of a multiple louver assembly may be segmented into multiple smaller louvers with, for instance, one or more smaller louvers containing interlock elements or tabs which are designed to project in front of respective fasteners securing the air-moving assembly within the chassis when the louvers are in operational orientation.

FIGS. 4A-5B described below depict a centrifugal fan assembly with a centrifugal fan rotor and housing, and a protective louver assembly comprising a plurality of louvers configured as elongated flaps with a pivot that hinges at one elongate edge, such that the weight of the louvers results in a substantially vertical orientation of each louver in the absence of a force from air pressure induced by the centrifugal fan rotor in a quiesced state, and when airflow from the centrifugal fan exerts pressure on the louvers, the weight of the louvers is overcome and the louvers are in a substantially horizontal, operational orientation, indicative of an operational state of the air-moving assembly.

Advantageously, one or more of the louvers includes an interlock element which is located and sized to project in front of a respective fastener securing the air-moving assembly to the chassis, to block access to the fastener when the air-moving assembly is in the operational state. As an enhancement, a protective shroud could be provided covering the fasteners and providing an enclosed region within which the interlock element(s) extend when the louvers are in operational orientation.

As noted, in certain implementations, one or more louvers may be fabricated smaller than one or more other louvers of the protective louver assembly so as to stay in the operational orientation longer. Alternatively, one of the louvers may be segmented into smaller louvers, with the smaller louvers referred to as control flap louvers, and the other remaining louvers referred to as anti-recirculation louvers. When transitioning from operational state to a quiesced state of the air-moving assembly, the centrifugal fan slows from an operational speed (of, for instance, 4000 RPMs), to eventually a stopped or quiesced position. During this transition, after the power is removed from the centrifugal fan rotor, as the speed of the rotor decreases, eventually the weight of the recirculation louvers overcomes the pressure exerted by the airflow, and the louvers fall to the vertical orientation, corresponding to the quiesced state of the air-moving assembly. At this time, the control flap louvers will continue to remain open due to their much smaller size and weight compared with the recirculation louvers. Once the anti-recirculation flaps close, the velocity, and therefore the momentum, of the airflow across the remaining control flap louvers, is increased, extending the amount of time required between de-energizing the rotor, and realizing the quiesced state, where all louvers are in substantially vertical orientation. The smaller control flap louvers include the interlock elements which project, in one embodiment, into the enclosed region defined by the shroud, to block access to the fasteners, through respective access openings in the shroud. This ensures that the smaller control flap louvers must also transition to the quiesced state, prior to an operator gaining access to the fasteners to remove the air-moving assembly from the chassis, thereby ensuring that the operator will not inadvertently remove an assembly with a rotor spinning at an unsafe speed.

FIGS. 4A-4E depict one embodiment of an apparatus 400, in accordance with one or more aspects of the present invention. Referring collectively to these figures, apparatus 400 includes an air-moving assembly 401, such as air-moving assembly 310 described above in connection with FIG. 3B, and a protective louver assembly 410, which includes in the depicted embodiment multiple louvers 411 and one or more interlock elements 415. In this embodiment, the air-moving assembly 401 is implemented as a centrifugal fan 407, which may be disposed, for instance, at the air outlet side of an electronic subsystem, such as within one of the electronic subsystems 101 described above in connection with FIG. 1. As noted, in this configuration, air is drawn in through an air inlet in a lower surface of the air-moving assembly and expelled through an air outlet 402, which may include a protective grid or grating 405.

Although depicted herein with multiple louvers 411, the protective louver assembly 410 could include one or more louvers, as desired for a particular configuration. Louvers 411 are illustrated in FIGS. 4A-4E in an operational orientation (which in this implementation is substantially horizontal) that assumes air-moving assembly 401 is in an operational state. In particular, in the operational orientation depicted in FIGS. 4A-4E, the centrifugal fan rotor is assumed to be spinning at an operational speed sufficient to impel an airflow through louvers 411 at a speed which overcomes the weight of the louvers acting on the louver-hinge axis 413 such that the louvers are maintained substantially horizontal, as depicted in the figures. Should the air-moving assembly be turned off, or fault, and thereby enter a quiesced state where there is little or no airflow moving through the assembly 401, then the louvers 411 drop to a quiesced orientation, where the louvers are substantially vertical, advantageously preventing any recirculation of air back through the quiesced air-moving assembly. Note that in an alternate implementation, where the air-moving assembly is disposed at the air inlet side of an electronic subsystem, the hinged louvers may pivot inwardly when transitioning from, for instance, a quiesced orientation to an operational orientation.

Figure 4A:
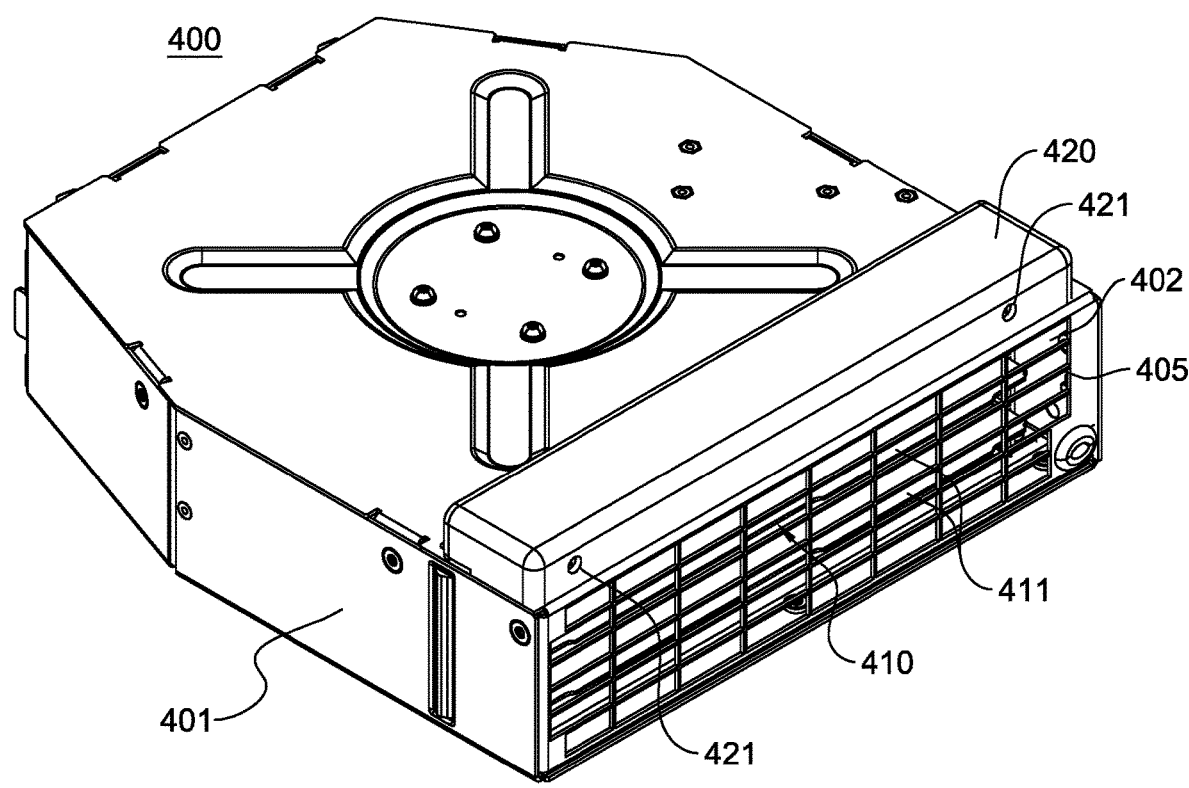
FIG. 4A depicts one embodiment of an apparatus comprising an air-moving assembly and a protective louver assembly, in accordance with one or more aspects of the present invention.
Figure 4B:
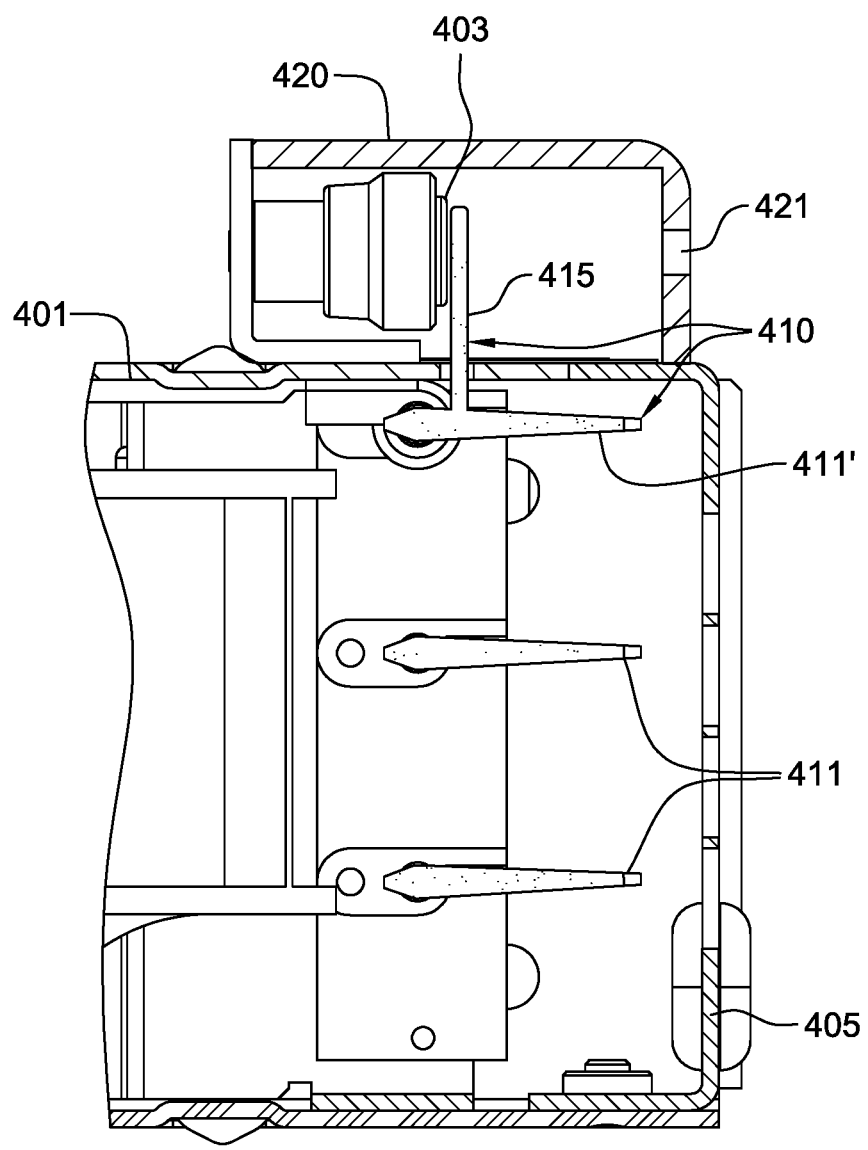
FIG. 4B is a partial cross-sectional side view of the apparatus of FIG. 4A, showing the blocking operation of the interlock element(s) in the operational orientation of the associated louver(s), in accordance with one or more aspects of the present invention.
Figure 4C:
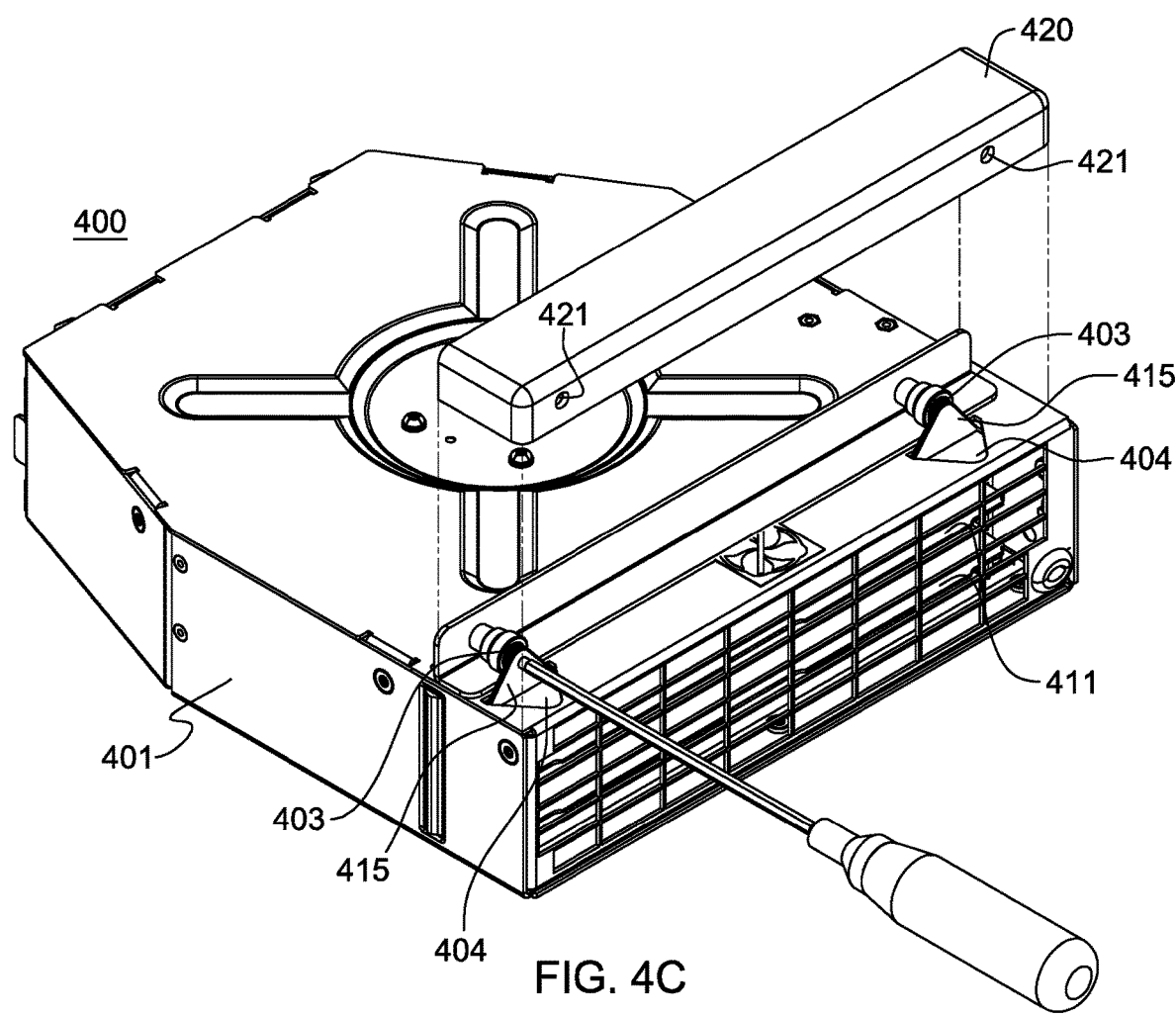
FIG. 4C depicts the apparatus of FIGS. 4A & 4B, with the louver(s) shown in operational orientation, and the protective shroud exploded from the apparatus, to illustrate the blocking operation of the interlock element(s), in accordance with one or more aspects of the present invention.
Figure 4D:
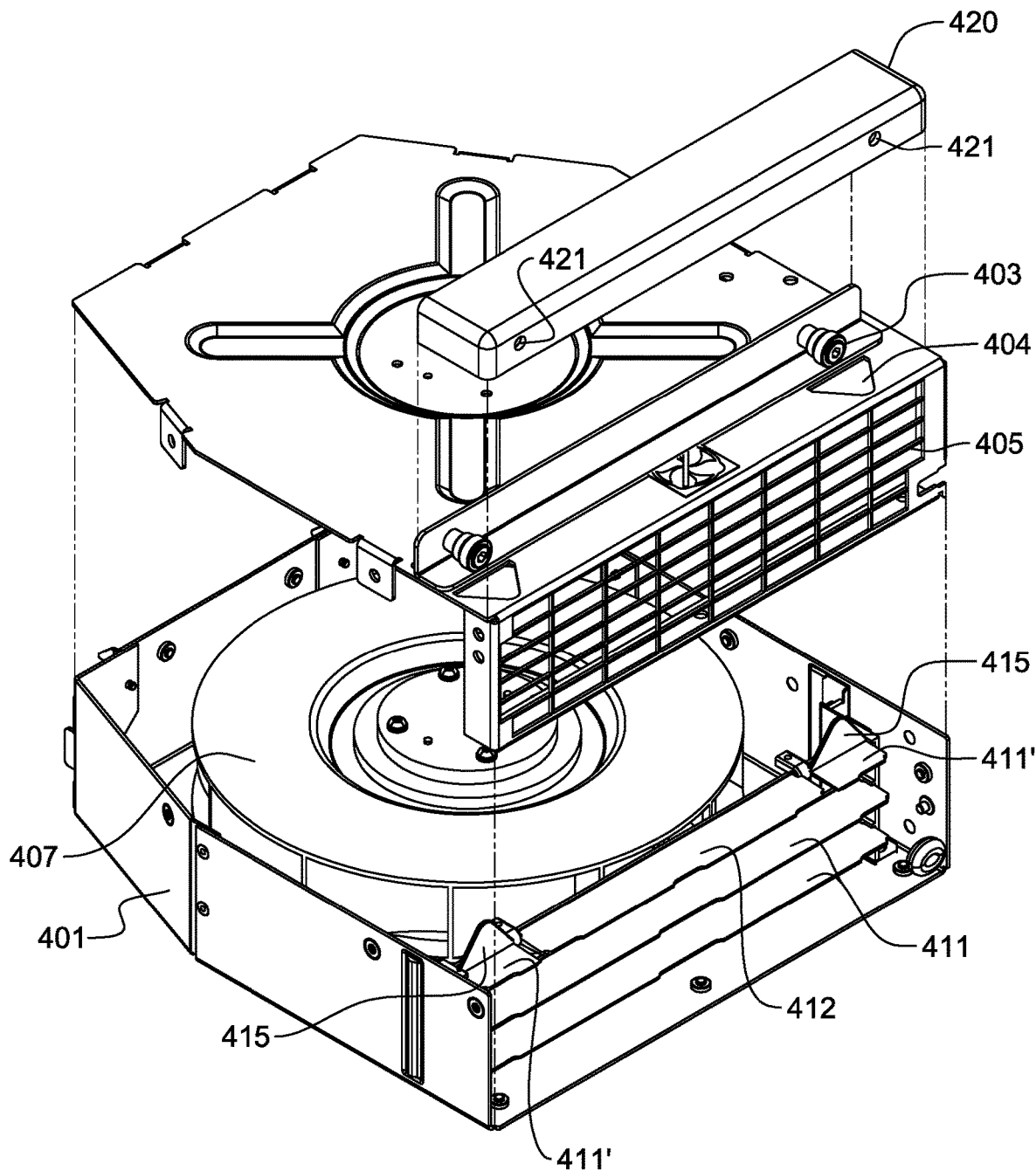
FIG. 4D depicts the apparatus of FIGS. 4A-4C, with the cover and outer grating exploded from the apparatus to illustrate one embodiment of the louvers and interlock elements of the protective louver assembly, in accordance with one or more aspects of the present invention.
Figure 4E:
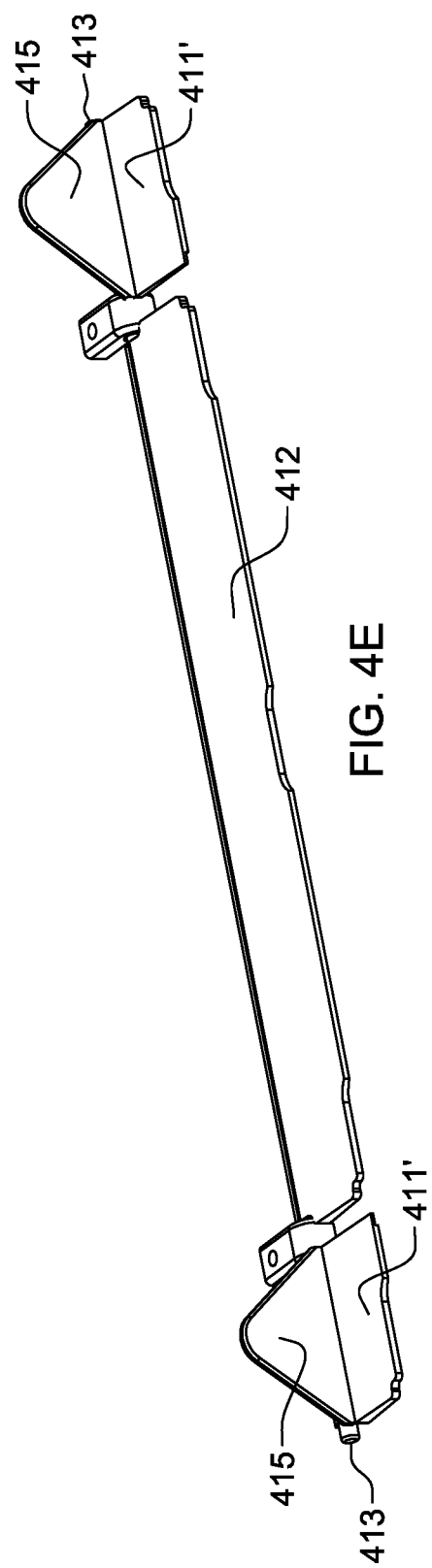
FIG. 4E depicts one embodiment of a segmented, main louver defining a row of differently-sized louvers, with the smaller louvers having the interlock elements of the protective louver assembly of FIGS. 4A-4D, in accordance with one or more aspects of the present invention.

As shown in FIGS. 4B-4E, one or more of the louvers 411' includes an interlock element 415 projecting therefrom, for instance, at a 90° angle, as illustrated in FIGS. 4B & 4E. In the embodiment depicted, interlock elements or tabs 415 project from respective, smaller (control flap) louvers 411' formed by segmenting a main louver 411 into the smaller louvers 411' and a central (anti-recirculation) louver 412, as illustrated in FIG. 4E. Interlock elements 415 project from the respective louvers near the louver hinge axis 413 in the embodiment illustrated. As noted, by making control flap louvers 411' with the interlock elements 415 smaller than anti-recirculation louvers 411, 412, then louvers 411' are maintained in the substantially horizontal, operational orientation longer as the air-moving assembly transitions from operational state to quiesced state, which as explained, provides additional safety to an operator attempting to gain access to the fasteners to remove the air-moving assembly from the chassis. As illustrated in FIGS. 4B & 4C, the interlock elements 415 extend into an at least partially enclosed region defined by protective shroud 420 to block access to fasteners 403 securing air-moving assembly 401 within the chassis (not shown) when the louvers are in an operational orientation. In the embodiment depicted, protective shroud 420 includes access openings 421 aligned to allow an operator access to fasteners 403, and the interlock elements are sized and positioned to extend into the at least partially enclosed region between the fasteners 403 and access openings 421 when in operational orientation, blocking access to the fasteners, as illustrated in FIG. 4C.

As shown in FIG. 4E, in one embodiment, a common louver hinge axis 413 is provided for the segmented louver depicted, which may be disposed as the upper-most louver of the multiple louvers at the air inlet or air outlet side of the air-moving assembly 401. For balanced pivoting, the interlock elements 415 are located at or adjacent to the louver hinge axis 413 of the smaller louvers 411'. In the embodiment illustrated, the interlock elements extend at a substantially 90° angle from the smaller louvers 411'. However, this is provided by way of example only. Similarly, the illustrated shape of interlock elements 415 is provided as one example only, with other configurations being possible to accomplish the functions described herein. Also, although illustrated in FIGS. 4A-4E as including two interlock elements (or tabs), the protective louver assembly could utilize a single interlock element, or more than two interlock elements, depending (for instance) on the number and location of assembly fasteners of a particular implementation.

As illustrated in FIGS. 4C & 4D, openings 404 are provided in the cover of the air-moving assembly 401 embodiment depicted to allow interlock elements 415 to project in front of fasteners 403 when the louvers 411' are in operational orientation. In the operational orientation of the smaller louvers, the interlock elements 415 are in a first direction, which is substantially orthogonal to the operational orientation of the louvers 411, 412, 411'. That is, in the embodiment depicted, the first direction of interlock elements 415 is substantially vertical.

Figure 5A:
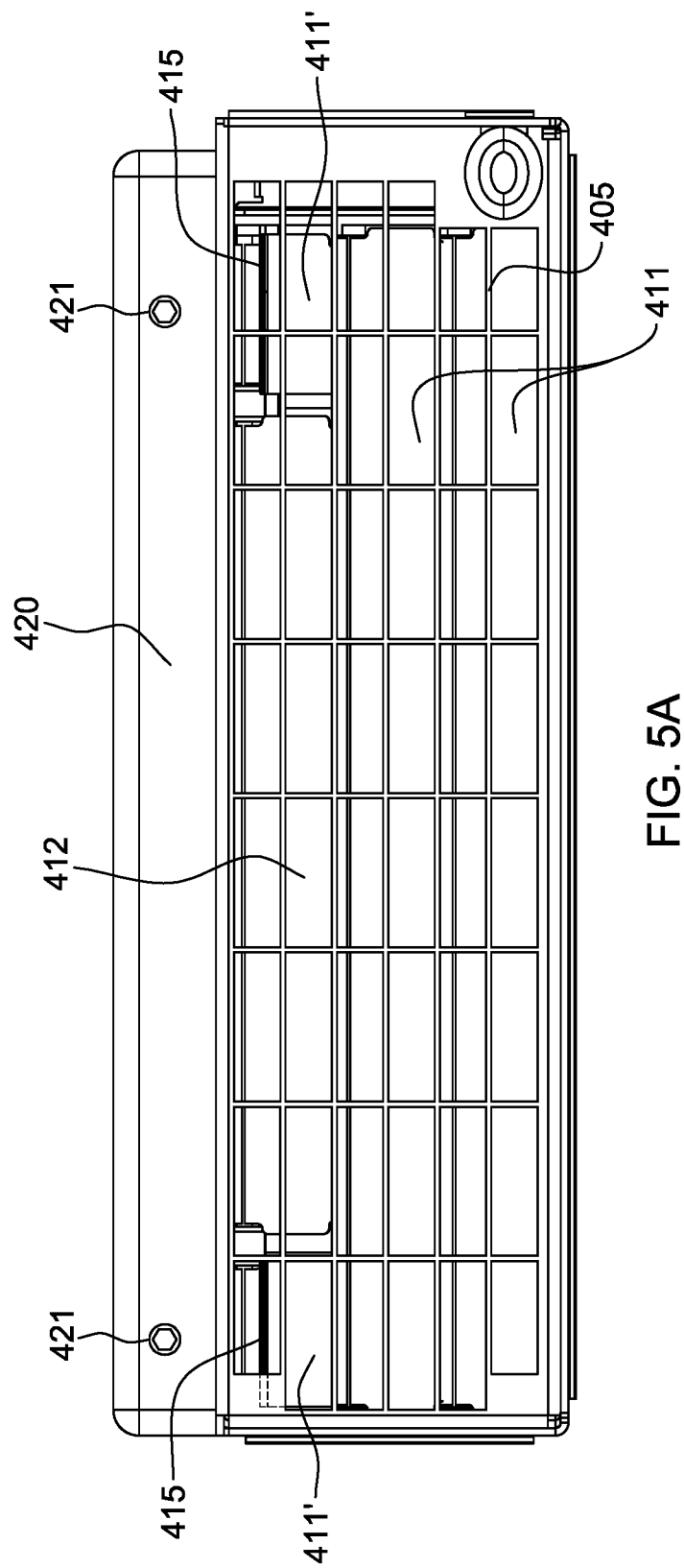
FIG. 5A is a front elevational depiction of the apparatus of FIGS. 4A-4E, with the louvers shown in the quiesced orientation, and the corresponding interlock elements oriented in a direction which allows access through respective access openings to the fasteners securing the air-moving assembly within the chassis, in accordance with one or more aspects of the present invention.
Figure 5B:
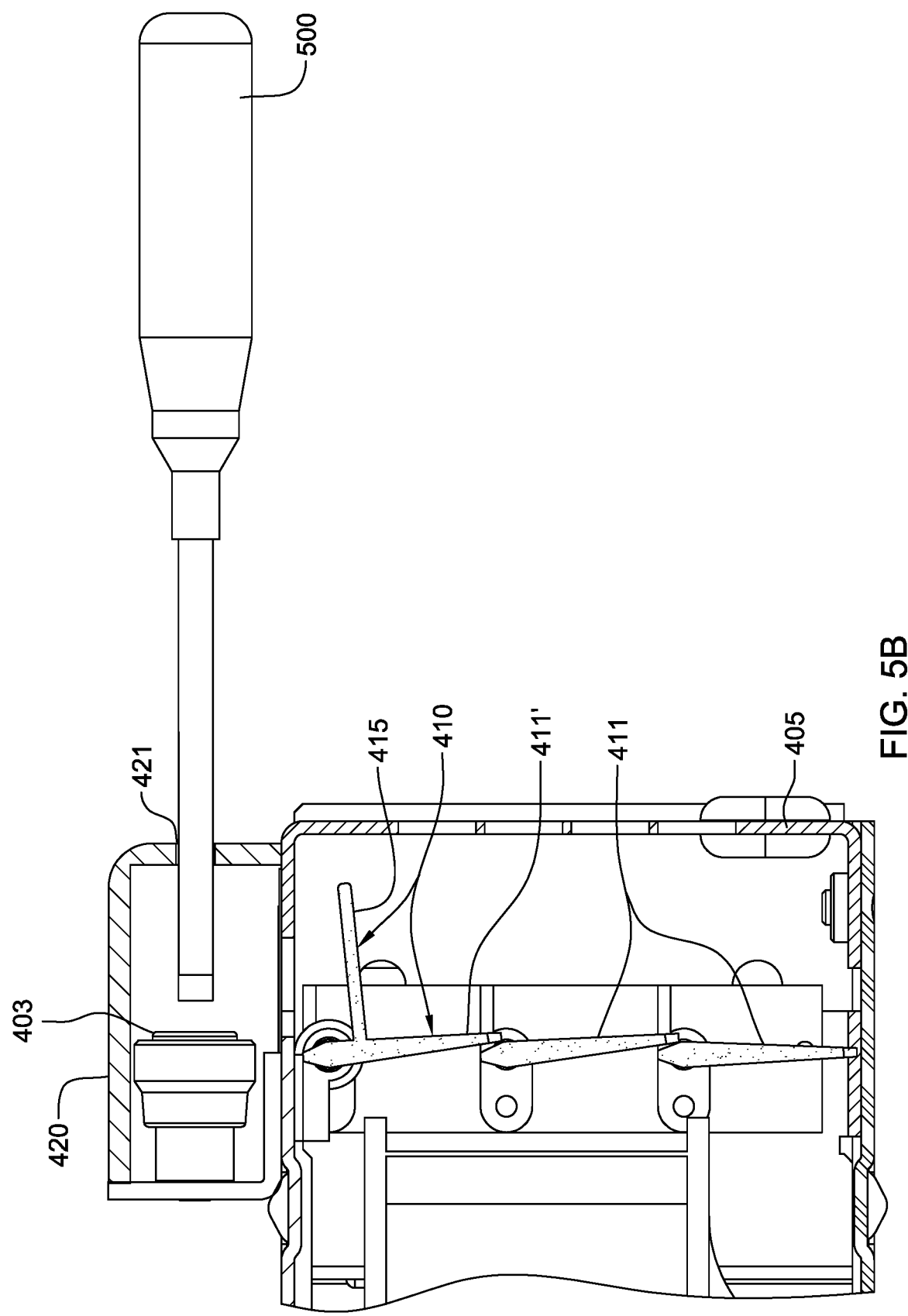
FIG. 5B is a partial cross-sectional side view of the apparatus of FIG. 5A, showing the interlock elements in the quiesced orientation of the associated louver(s), in accordance with one or more aspects of the present invention.

FIGS. 5A & 5B depict the apparatus of FIGS. 4A-4E, with the louvers 411, 411', 412 shown in quiesced orientation, that is, substantially vertical, to close off the air outlet side of the air-moving assembly. As illustrated in FIGS. 5A & 5B, with the louvers 411' in quiesced orientation, the interlock elements 415, which (in one embodiment) are oriented orthogonal to the louvers, are substantially horizontal, as shown. In this orientation, the interlock elements 415 drop away from the enclosed region defined by protective enclosure 420, and thus allow access through access openings 421 to fasteners 403 using an appropriate tool 500.

Figure 6:
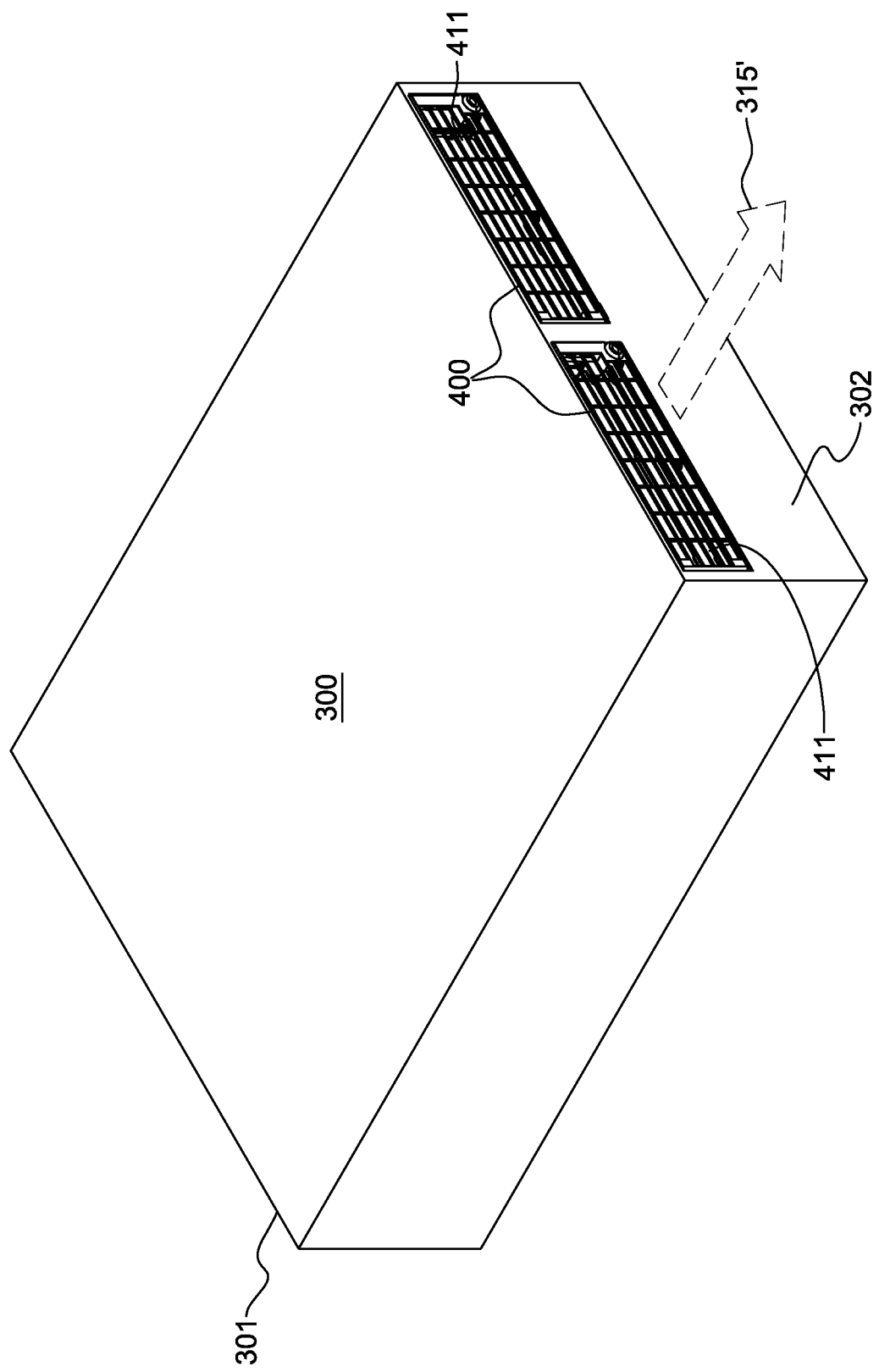
FIG. 6 depicts one embodiment of two air-moving and protective louver assemblies disposed side-by-side within a chassis, with one air-moving assembly shown in operational state, and the other air-moving assembly shown in quiesced state, in accordance with one or more aspects of the present invention.

FIG. 6 depicts the electronic subsystem chassis 300 of FIG. 3, with the apparatus 400 of FIGS. 4A-5B. In this depiction, the left-most air-moving assembly is assumed to be operational, with airflow 315' egressing across the respective louvers 411 in operational orientation, and the right-most air-moving assembly is assumed to be in quiesced state, with the louvers 411 of that apparatus shown in quiesced orientation, substantially vertical, thereby blocking any recirculation of egressing airflow 315' back into chassis 300, through the quiesced air-moving assembly. Thus, the protective louver assembly, in addition to providing the above-described facility for preventing removal of the air-moving assembly when airflow is passing through the assembly, also prevents recirculation of egressing airflow from one assembly back into the chassis through a quiesced assembly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
  a protective louver assembly of an air-moving assembly, the protective louver assembly comprising:
    at least one louver disposed within the air-moving assembly at one of an air inlet or an air outlet of the air-moving assembly, the air-moving assembly being removable when in a non-operational state from a housing within which the air-moving assembly resides when in an operational state, and being secured within the housing via at least one fastener, and the at least one louver pivoting between an operational orientation and a quiesced orientation, dependent on presence or absence, respectively, of airflow through the air-moving assembly; and
    at least one interlock element extending away from a longitudinal axis of the at least one louver and pivoting with the at least one louver between the operational orientation and the quiesced orientation, wherein the longitudinal axis of the at least one louver is offset from the at least one fastener securing the air-moving assembly within the housing, and an interlock element of the at least one interlock element biasing a louver of the at least one louver towards the quiesced orientation and being sized and positioned to project in front of and cover a fastener head of the at least one fastener securing the air-moving assembly within the housing to block access in the operational state to the fastener head and thereby prevent removal of the air-moving assembly from the housing in the operational state.

2. The apparatus of claim 1, wherein one interlock element of the at least one interlock element is integrated with and projecting at an angle from one louver of the at least one louver to block access to one fastener of the at least one fastener securing the air-moving assembly within the housing in the operational orientation.

3. The apparatus of claim 2, wherein the one interlock element of the at least one interlock element projects at a substantially 90° angle from the one louver of the at least one louver.

4. The apparatus of claim 2, wherein the one louver is substantially horizontal when in the operational orientation, and the one interlock element projecting therefrom is substantially vertical in the operational orientation.

5. The apparatus of claim 1, wherein the air-moving assembly includes a protective shroud enclosing, at least in part, the at least one fastener, the protective shroud including at least one access opening allowing access to the at least one fastener, and the at least one interlock element extending into an at least partially enclosed region defined by the protective shroud when in the operational orientation.

6. The apparatus of claim 5, wherein the at least one interlock element blocks access to the at least one fastener through the at least one access opening in the protective shroud in the operational orientation.

7. The apparatus of claim 1, wherein the protective louver assembly comprises multiple louvers disposed at the one of the air inlet or the air outlet of the air-moving assembly, the multiple louvers including the at least one louver, and each pivoting between the operational orientation and the quiesced orientation, dependent on presence or absence, respectively, of airflow through the air-moving assembly, and wherein one louver of the multiple louvers is sized smaller than another louver of the multiple louvers, the one louver including one interlock element of the at least one interlock element.

8. The apparatus of claim 7, wherein the one louver smaller than the another louver remains in the operational orientation longer than the another louver during a transition of the multiple louvers from the operational orientation to the quiesced orientation due to a decreasing airflow through the air-moving assembly.

9. The apparatus of claim 8, wherein the one louver is half the size, or less, of the another louver of the multiple louvers.

10. The apparatus of claim 1, wherein the air-moving assembly comprises a centrifugal fan, and the at least one louver is hingedly coupled to the air-moving assembly at the air outlet thereof.

11. An apparatus comprising:
an air-moving assembly residing within a housing when in an operational state, the air-moving assembly being removable from the housing when in a non-operational state and being secured within the housing in the operational state via at least one fastener; and
the air-moving assembly comprising a protective louver assembly, the protective louver assembly comprising:
at least one louver disposed at one of an air inlet or an air outlet of the air-moving assembly, the at least one louver pivoting between an operational orientation and a quiesced orientation, dependent on presence or absence, respectively, of airflow through the air-moving assembly; and
at least one interlock element extending away from a longitudinal axis of the at least one louver and pivoting with the at least one louver between the operational orientation and the quiesced orientation, wherein the longitudinal axis of the at least one louver is offset from the at least one fastener securing the air-moving assembly within the housing, and an interlock element of the at least one interlock element biasing a louver of the at least one louver towards the quiesced orientation and being sized and positioned to project in front of and cover a fastener head of the at least one fastener securing the air-moving assembly within the housing to block access in the operational state to the fastener head and thereby prevent removal of the air-moving assembly from the housing in the operational state.

12. The apparatus of claim 11, wherein the housing further comprises one or more electronic components to be cooled, at least in part, by the airflow through the air-moving assembly when in the operational state.

13. The apparatus of claim 11, wherein one interlock element of the at least one interlock element is integrated with and projecting at an angle from one louver of the at least one louver to block access to the at least one fastener securing the air-moving assembly within the housing in the operational orientation.

14. The apparatus of claim 13, wherein the one louver is substantially horizontal when in the operational orientation, and the one interlock element projecting therefrom is substantially vertical in the operational orientation.

15. The apparatus of claim 11, wherein the air-moving assembly further comprises a protective shroud enclosing, at least in part, the at least one fastener, the protective shroud including at least one access opening allowing access to the at least one fastener, and the at least one interlock element extending into an at least partially enclosed region defined by the shroud when in the operational orientation.

16. The apparatus of claim 15, wherein the at least one interlock element blocks access to the at least one fastener through the at least one access opening in the protective shroud in the operational orientation.

17. The apparatus of claim 11, wherein the protective louver assembly comprises multiple louvers disposed at the one of the air inlet or the air outlet of the air-moving assembly, the multiple louvers including the at least one louver, and each pivoting between the operational orientation and the quiesced orientation, dependent on presence or absence, respectively, of airflow through the air-moving assembly, and wherein one louver of the multiple louvers is sized smaller than another louver of the multiple louvers, the one louver including one interlock element of the at least one interlock element.

18. The apparatus of claim 17, wherein the one louver smaller than the another louver remains in the operational orientation longer than the another louver during a transition of the multiple louvers from the operational orientation to the quiesced orientation due to a decreasing airflow through the air-moving assembly.

19. The apparatus of claim 18, wherein the one louver is half the size, or less, of the another louver of the multiple louvers.

20. A method comprising:
providing a protective louver assembly integrated with an air-moving assembly, the air-moving assembly residing within a housing when in operational state and being removable from the housing when in a non-operational state, and the air-moving assembly being secured within the housing in the operational state via at least one fastener, the protective louver assembly comprising:
at least one louver disposed at one of an air-inlet or an air-outlet of the air-moving assembly, the at least one louver pivoting between an operational orientation and a quiesced orientation, dependent on presence or absence, respectively, of airflow through the air-moving assembly; and at least one interlock element extending away from a longitudinal axis of the at least one louver and pivoting with the at least one louver between the operational orientation and the quiesced orientation, wherein the longitudinal axis of the at least one louver is offset from the at least one fastener securing the air-moving assembly within the housing, and an interlock element of the at least one interlock element biasing a louver of the at least one louver towards the quiesced orientation and being sized and positioned to project in front of and cover a fastener head of the at least one fastener securing the air-moving assembly within the housing to block access in the operational state to the fastener head and thereby prevent removal of the air-moving assembly from the housing in the operational state.

* * * * *